(12) United States Patent
Chu et al.

(10) Patent No.: US 11,217,294 B2
(45) Date of Patent: Jan. 4, 2022

(54) TECHNIQUES FOR ADJUSTING CURRENT BASED ON OPERATING PARAMETERS

(71) Applicant: Micron Technology, Inc., Boise, ID (US)

(72) Inventors: Wei Lu Chu, Shanghai (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/852,019

(22) Filed: Apr. 17, 2020

(65) Prior Publication Data

US 2021/0327488 A1    Oct. 21, 2021

(51) Int. Cl.
| | |
|---|---|
| *G11C 5/14* | (2006.01) |
| *G11C 11/22* | (2006.01) |
| *G05F 1/59* | (2006.01) |
| *G05F 1/575* | (2006.01) |
| *G11C 11/4074* | (2006.01) |

(52) U.S. Cl.
CPC .......... *G11C 11/2297* (2013.01); *G05F 1/575* (2013.01); *G05F 1/59* (2013.01); *G11C 11/221* (2013.01); *G11C 11/4074* (2013.01)

(58) Field of Classification Search
CPC .............. G11C 11/2297; G11C 11/221; G11C 11/4074; G05F 1/575; G05F 1/59
See application file for complete search history.

(56) References Cited

U.S. PATENT DOCUMENTS

| | | | | |
|---|---|---|---|---|
| 9,136,807 | B2* | 9/2015 | Wurcer | H03F 3/45475 |
| 9,740,223 | B1* | 8/2017 | Wang | G05F 1/575 |
| 9,973,164 | B1* | 5/2018 | Long | H03F 3/45 |
| 2007/0210776 | A1* | 9/2007 | Oka | H02M 3/156 |
| | | | | 323/283 |

* cited by examiner

*Primary Examiner* — Pho M Luu
(74) *Attorney, Agent, or Firm* — Holland & Hart LLP (57) ABSTRACT

Methods, systems, and devices for techniques for adjusting current based on operating parameters are described. An apparatus may include an amplifier, a feedback component, and first and second current generators. The amplifier may include an input for receiving a first voltage and an output for outputting a second voltage. The first current generator may be coupled with the output of the amplifier and generate a first current based at least in part on the second voltage. The feedback component may be coupled with the first current generator to modify the first current based at least in part on an operating temperature associated with a memory device. The first current may be proportional to the operating temperature. The second current generator may be coupled with the first current generator to generate a second current based at least in part on the first current modified by the feedback component.

18 Claims, 6 Drawing Sheets

TECHNIQUES FOR ADJUSTING CURRENT BASED ON OPERATING PARAMETERS

BACKGROUND

The following relates generally to one or more memory systems and more specifically to techniques for adjusting current based on operating parameters.

Memory devices are widely used to store information in various electronic devices such as computers, wireless communication devices, cameras, digital displays, and the like. Information is stored by programing memory cells within a memory device to various states. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

In some memory devices, the use of current in an electrical circuit may vary based on different operating conditions of the memory device. For example, currents may vary based on the temperature of the memory device, other currents on the memory device, manufacturing variances of different components in the memory system, or a combination thereof. In some examples, some currents may vary with some operating parameters in a complementary manner rather than a proportional manner. For example, the amount of current provided to a memory device may vary inversely to an operating temperature of the memory device (e.g., higher temperatures may cause lower currents). But in many cases, a memory device may use more current at higher temperatures, not less (e.g., current usage may vary proportional with operating temperature).

Techniques, systems, and devices are described for providing a current for a memory device so the current varies in a directly proportional manner to an operating parameter of the memory device. A current modifying component may include a feedback component that includes a tracker component. The tracker component may include two or more transistors in a diode configuration. The tracker component may be configured to vary an output current or an output voltage based at least in part on the temperature of the memory device, other currents or voltages on the memory device, manufacturing variances of different components in the memory system, or a combination thereof.

Features of the disclosure are initially described in the context of memory systems and dies as described with reference to FIG. 1. Features of the disclosure are described in the context of circuits and corresponding plots that relate to techniques for adjusting current based on operating temperature as described with reference to FIGS. 2-4. These and other features of the disclosure are further illustrated by and described with reference to an apparatus diagram and a flowchart that relate to techniques for adjusting current based on operating parameters as described with references to FIGS. 5-6.

Figure 1:
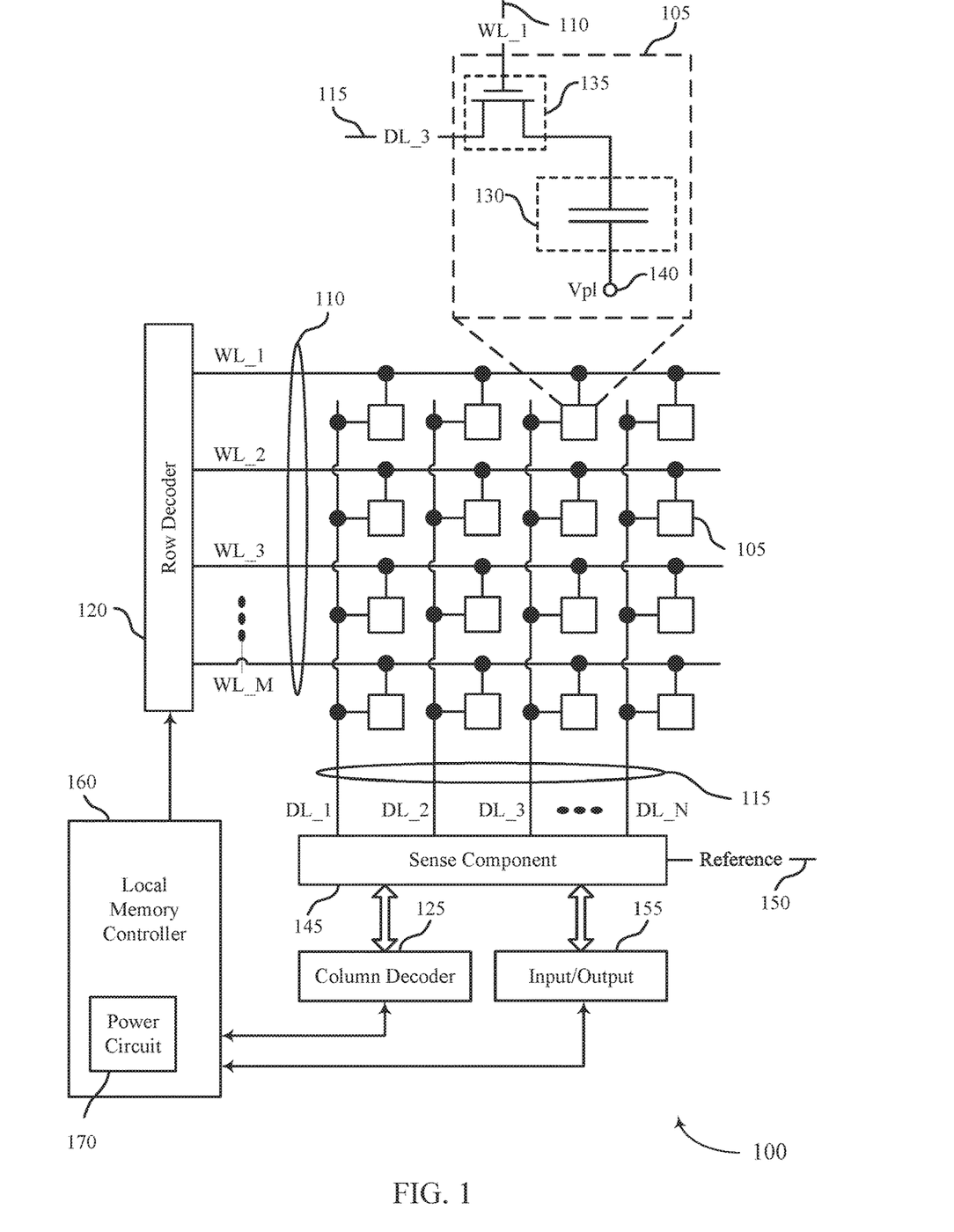
FIG. 1 illustrates an example of a memory die that supports techniques for adjusting current based on operating parameters in accordance with examples as disclosed herein.

FIG. 1 illustrates an example of a memory die 100 that supports techniques for adjusting current based on operating parameters in accordance with examples as disclosed herein. In some examples, the memory die 100 may be referred to as a memory chip, a memory device, or an electronic memory apparatus. The memory die 100 may include one or more memory cells 105 that may each be programmable to store different logic states (e.g., programmed to one of a set of two or more possible states). In some examples, the memory cells 105 may be arranged in an array.

A memory cell 105 may store a charge representative of the programmable states in a capacitor. DRAM architectures may include a capacitor that includes a dielectric material to store a charge representative of the programmable state. In other memory architectures, other storage devices and components are possible. The memory cell 105 may include a logic storage component, such as capacitor 130, and a switching component 135. The capacitor 130 may be an example of a dielectric capacitor or a ferroelectric capacitor. A node of the capacitor 130 may be coupled with a voltage source 140, which may be the cell plate reference voltage, such as Vpl, or may be ground, such as Vss.

The memory die 100 may include one or more access lines (e.g., one or more word lines 110 and one or more digit lines 115) arranged in a pattern, such as a grid-like pattern. An access line may be a conductive line coupled with a memory cell 105 and may be used to perform access operations on the memory cell 105. In some examples, word lines 110 may be referred to as row lines. In some examples, digit lines 115 may be referred to as column lines or bit lines. Memory cells 105 may be positioned at intersections of the word lines 110 and the digit lines 115.

Operations such as reading and writing may be performed on the memory cells 105 by activating or selecting access lines such as one or more of a word line 110 or a digit line 115. By biasing a word line 110 and a digit line 115 (e.g., applying a voltage to the word line 110 or the digit line 115), a single memory cell 105 may be accessed at their intersection. The intersection of a word line 110 and a digit line 115 in either a two-dimensional or three-dimensional configuration may be referred to as an address of a memory cell 105.

Accessing the memory cells 105 may be controlled through a row decoder 120 or a column decoder 125. For example, a row decoder 120 may receive a row address from the local memory controller 160 and activate a word line 110 based on the received row address. A column decoder 125 may receive a column address from the local memory controller 160 and may activate a digit line 115 based on the received column address.

Selecting or deselecting the memory cell 105 may be accomplished by activating or deactivating the switching component 135 using a word line 110. The capacitor 130 may be coupled with the digit line 115 using the switching component 135. For example, the capacitor 130 may be isolated from digit line 115 when the switching component 135 is deactivated, and the capacitor 130 may be coupled with digit line 115 when the switching component 135 is activated.

The sense component 145 may be operable to detect a state (e.g., a charge) stored on the capacitor 130 of the memory cell 105 and determine a logic state of the memory cell 105 based on the stored state. The sense component 145 may include one or more sense amplifiers to amplify or otherwise convert a signal resulting from accessing the memory cell 105. The sense component 145 may compare a signal detected from the memory cell 105 to a reference 150 (e.g., a reference voltage). The detected logic state of the memory cell 105 may be provided as an output of the sense component 145 (e.g., to an input/output 155), and may indicate the detected logic state to another component of a memory device that includes the memory die 100.

The local memory controller 160 may control the accessing of memory cells 105 through the various components (e.g., row decoder 120, column decoder 125, sense component 145). In some examples, one or more of the row decoder 120, column decoder 125, and sense component 145 may be co-located with the local memory controller 160. The local memory controller 160 may be operable to receive one or more commands or data from one or more different memory controllers (e.g., an external memory controller associated with a host device or another controller associated with the memory die 100), translate the commands or the data (or both) into information that can be used by the memory die 100, perform one or more operations on the memory die 100, and communicate data from the memory die 100 to a host device based on performing the one or more operations. The local memory controller 160 may generate row signals and column address signals to activate the target word line 110 and the target digit line 115.

The local memory controller 160 may also generate and control various voltages or currents used during the operation of the memory die 100. For example, the local memory controller 160 may include a power circuit 170 that may control voltages and currents of the memory die 100 based on operating parameters. The power circuit 170 may use a current mirror for adjusting current based on operating parameters in accordance with examples as disclosed herein.

A current mirror is a circuit designed to copy an output current through an active output device by controlling a current in an internal active device. This keeps the output current constant regardless of loading. This type of circuit may be useful to power external circuits. For example, a current mirror may be used to output a constant current to an array of memory cells. In many cases, though, the current used by the external circuit (e.g., memory cells) may not be constant. For example, the amount of current used by the external circuit may vary based on an operating temperature of the external circuit (e.g., higher temperatures may cause larger currents).

In some circuits (e.g., current mirror circuits), the current of the internal active device may be inversely proportional to a change in a temperature of the external circuit. That is, as the temperature of the external circuit rises, the current supplied to the internal active device may go down. Because the output current mirrors this internal current, the output current supplied to other parts of the memory device (e.g., the memory array) may also go down. For some circuits the inversely proportional relationship between temperature and current output may cause inefficiencies in the circuit. In some cases, an external circuit may use more current at higher temperatures, not less. To compensate, a circuit may be designed so that the current that is output by the active output device is greater than or equal to the amount used by the external circuit at the highest operating temperature. In circuits where the output current is inversely proportional to the change in temperature, the active output device may be designed to provide more current at lower temperatures than it provides at higher temperatures. In such cases, the active output device may be designed to be larger than used and at lower temperatures and efficiency may be lost.

Devices, systems, and techniques are described herein for a circuit that may be designed so that the internal current and external current are both directly proportional with the temperature of the external circuit. In such cases, as the operating temperature of the external circuit rises, so may the current output by the active output device, to meet the increased power demands of the external circuit. As a result, the active output device may be more efficient and may be designed to be smaller (e.g., use less die area).

Figure 2:
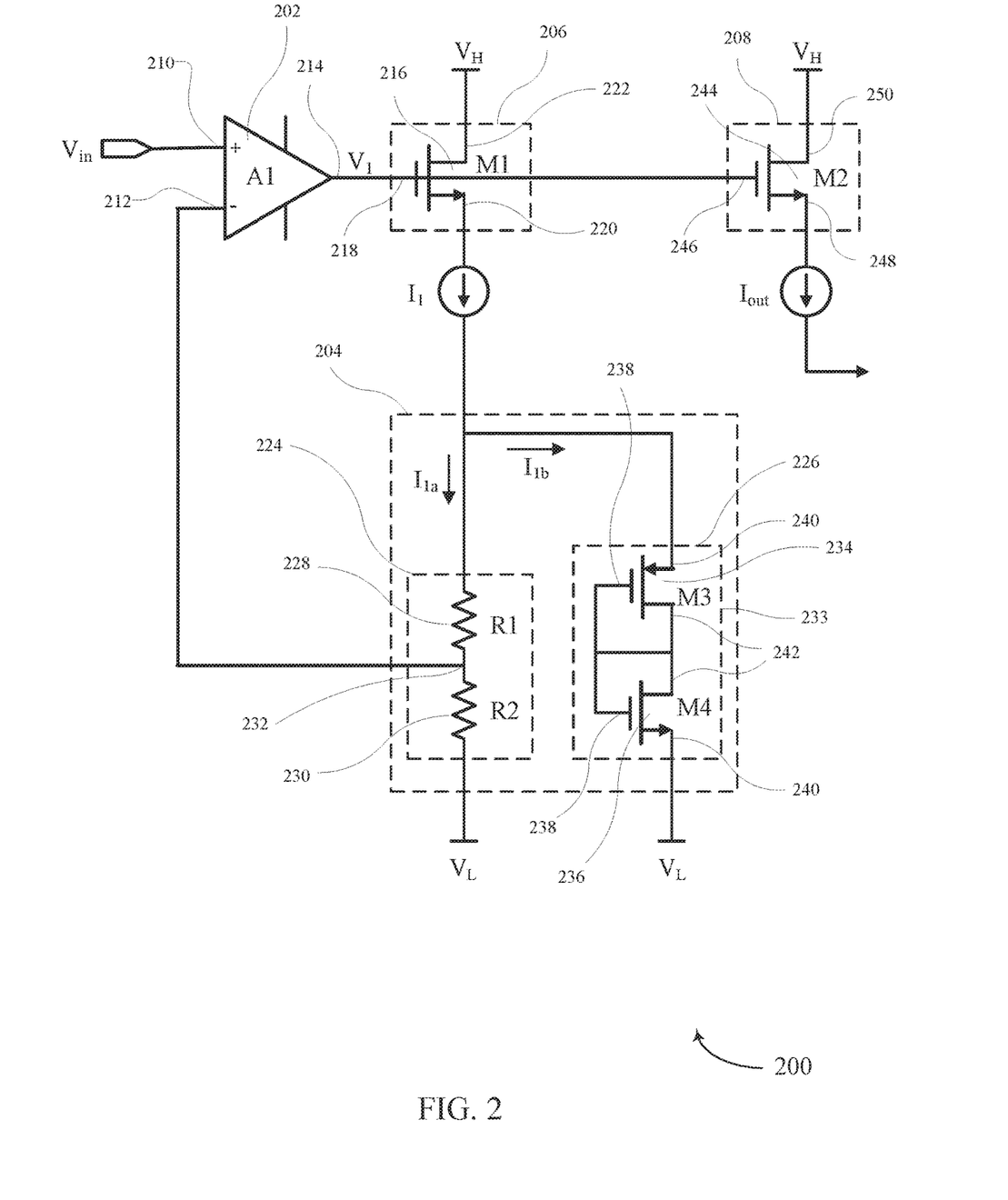
FIG. 2 illustrates an example of a circuit diagram that supports techniques for adjusting current based on operating parameters in accordance with examples as disclosed herein.

FIG. 2 illustrates an example of a circuit diagram 200 that supports techniques for adjusting current based on operating parameters in accordance with examples as disclosed herein. The circuit 200 may be illustrative of a power circuit 170 that provides current to a representative population of memory cells 105 of a memory device.

The circuit diagram 200 may be an example of a current mirror. The circuit diagram 200 may include an amplifier 202, a feedback component 204, a first current generator 206, and a second current generator 208.

The amplifier 202 may have a first input 210, a second input 212 and an output 214. The first input 210 may receive an input voltage Vin, and the second input 212 may receive a feedback from the feedback component 204. The Vin voltage may be an example of a voltage used to operate an array of memory cells or other part of a memory device. The output 214 may output a first voltage V1 based on the first input 210 and the second input 212. In the circuit 200, the amplifier 202 may be an example of an op amp A1 in a non-inverting configuration and having a gain G equal to V1/Vin. In some cases, the gain of the amplifier 202 may be based on the feedback component 204. The first input 210 may be an example of a positive input and the second input 212 may be an example of a negative input. The input voltage Vin may be received at the first input 210 and feedback from the feedback component 204 may be received at the second input 212.

The first current generator 206 may comprise a first transistor 216, which sometimes may be referred to as a first current generator. The transistor 216 may include a gate 218, a source 220, and a drain 222. In some cases, the first transistor 216 may be an example of a power transistor. The drain 222 may be coupled with a high voltage Vh, such as e.g., Vpl, and the gate 218 may be coupled with the output 214 of the amplifier 202. The gate 218 may form a switch that may allow current to flow through the transistor 216 from the drain 222 to the source 220. The amount of current may be based on the gain. In some cases, the first current generator 206 may have a gain of one (1). Other gain values may also be used.

The feedback component 204 may have a resistive component 224 and a tracking component 226, that may be coupled with the source 220 of the first transistor 216 and may both draw current therefrom. The resistive component 224 may comprise a pair of resisters, such as a first resistor 228 and a second resistor 230, that may be coupled together to form a voltage divider. The first resistor 228 and the second resistor 230 may be coupled at one end to form a node 232. A second end of the first resistor 228 may be coupled to the first current generator 206. A second end of the second resistor 230 may be coupled to a low voltage VL, such as, e.g., ground or Vss. The node 232 may be coupled with the second input 212 of the amplifier 202. In such a configuration, the resistive component 224 may form a voltage divider for the amplifier 202 and the gain G of the amplifier 202 may be determined by: $G=1+(R1/R2)$, where R1 is the resistance of the first resistor 228 and R2 is the resistance of the second resistor 230. The first resistor 228 and the second resistor 230 may include two or more resistors linked together or may be a single resistor with the node formed therein.

The tracking component 226 may be configured to cause the output current to be proportional to the operating temperature rather than inversely proportional to the operating temperature. For example, circuits that include the resistive component 224 and not the tracking component 226 may output currents that are inversely proportional (e.g., complementary) to the operating temperature associated with the external circuit. The tracking component 226 may comprise a pair of transistors 233, such as a first tracking transistor 234 and a second tracking transistor 236, that may be coupled with each other in a diode configuration. The first tracking transistor 234 and the second tracking transistor 236 may be field effect transistors (FETs). The first tracking transistor 234 may be a p-channel transistor and the second tracking transistor 236 may be an n-channel transistor. The first tracking transistor 234 and the second tracking transistor 236 may each include a gate 238, a source 240, and a drain 242. The gates 238 and drains 242 of both the first tracking transistor 234 and the second tracking transistor 236 may be coupled together. The source 240 of the first tracking transistor 234 may be coupled with the first current generator 206 and may draw current therefrom. The source 240 of the second tracking transistor 236 may be coupled with VL. Other types of transistors and transistor configurations are also possible. For example, a second pair of transistors, coupled with each other in a diode configuration, can be coupled with the first tracking transistor 234 and the second tracking transistor 236, as described below.

The second current generator 208 may comprise a second transistor 244, which sometimes may be referred to as a second current generator. The second transistor 244 may include a gate 246, a source 248, and a drain 250. In some cases, the second transistor 244 may be an example of a power transistor. The drain 250 may be coupled with a high voltage Vh and the gate 246 may be coupled with the output 214 of the amplifier 202. The gate 246 may form a switch that may allow current to flow through the second transistor 244 from the drain 250 to the source 248. The current Iout output from the second current generator 208 may be provided to an external memory array. The second current generator 208 may be configured to generate the output current Iout to mirror the first current I1 generated by the first current generator 206. The second current generator 208 may have a gain of 10. Other gain values may also be possible. The second current generator 208 may have a gain that is higher than the first current generator 206. For example, the second current generator 208 may have a gain that is 10 times higher than the gain of the first current generator 206. Other gain differences may also be possible.

At a first operating temperature, the amplifier 202 may receive the input voltage Vin at the first input 210. The amplifier 202 may cause a first voltage V1 to appear at its output 214. The first voltage V1 may be received at the gate 218 of the first transistor 216 of the first current generator 206. This may switch on the first current generator 206 and may cause the first current I1 to flow through the first transistor 216. The first current I1 may be based at least in part on the input voltage and the operating temperature of the memory device.

The feedback component 204 may draw the current I1 from the transistor 216. A first portion I1a of the current I1 may flow through the resistive component 224. A second portion I1b of the current I1 may flow through the tracking component 226. The amount of current flowing through the resistive component 224 may be determined by $I1a=Vh/R1$. The amount of current flowing through the tracking component 226 may be equal to the amount flowing through the first tracking transistor 234 and the second tracking transistor 236. The total amount of the first current I1 may equal the sum of the first portion I1a and the second portion I1b.

The voltage V1 may also be received at the gate 246 of the second transistor 244 of the second current generator 208. This may switch on the second current generator 208 and may cause the output current Iout to flow through the second transistor 244. The output current Iout may be provided to an array of memory cells 105 external to the circuit 200 illustrated in FIG. 2. The output current Iout may mirror the current I1 drawn from the first transistor 216. The current Iout may mirror the current I1 at a difference between the gain of the second generator and the gain of the first current generator. In one example, the gain difference is 1000 so that the current Iin is in an order of microamps and the current Iout is in an order of milliamps.

As described herein, an operating temperature of an external circuit (e.g., an array of memory cells) may affect the amount of current used by an external circuit. In some cases, as the operating temperature rises, the external circuit may use more current. To account for those cases, the first current I1 and the output current Iout may both be directly proportional with respect to a change in the operating temperature. That is, as the temperature rises, both the first current I1 and the output current Iout may go up. Because Iout may go up with the temperature, more current is available for the external circuit.

In general, as temperatures rise, resistance values of resistors also rise. In those cases, the resistance values of the first resistor 228 and the second resistor 230 in the resistive component 224 may both rise when the temperature rises. Because $I=V/R$, the first portion I1a of the first current I1 may go down with the rise in resistance. So as the temperature goes up, the first portion I1a may go down. In those cases, the first portion I1a may be inversely proportional with respect to a change in the operating temperature.

In general, as temperatures rise, diodes draw more current. So when the first tracking transistor 234 and the second tracking transistor 236 of the tracking component 226 are configured in a diode configuration, they may draw more current with a rise in temperature. So, the second portion I1b of the first current I1 may go up with the rise in temperature. In those cases, the second portion I1b may be directly proportional with respect to a change in the operating temperature.

The total current I1 may equal the sum of the first portion I1a and the second portion I1b. The transistors 234, 236 may be designed or selected so that as the temperature rises, the first portion I1b of the first current I1 may rise at a greater rate than the second portion I1a falls. In those cases, the total current I1 may rise with the rise in temperature. So the total current I1 may be directly proportional with respect to a change in the operating temperature.

The output current Iout may mirror the first current I1. So in those cases in which the first current I1 rises with a rise in the operating temperature, the output current Iout may also rise with a rise in the operating temperature and may be directly proportional with respect to a change in the operating temperature.

At a second operating temperature that is higher than the first operating temperature, the amplifier 202 may receive another input voltage Vin' and output another first voltage V1'. The voltage and current values at the second operating temperature may be different from those of the first operating temperature. The first voltage V1' may not be equal to the original first voltage V1. The first current generator 206 may again be switched on by the voltage V1' and a first current I1' may flow through the transistor 216.

The feedback component 204 may draw the first current I1' from the transistor 216. As before, a first portion I1a' of the first current I1' may flow through the resistive component 224 and a second portion I1b' may flow through the tracking component 226. As discussed above, the current that flows through the resistive component 224 may be inversely proportional to the operating temperature and the current that flows through the tracking component 226 may be directly proportional to the operating temperature. So, the first portion I1a' of the first current I1' may be less than the first portion I1a of the original first current I1 and the second portion I1b' of the first current I1' may be greater than the second portion I1b of the original first current I1. In some cases, the first portion I1b' may have risen at a greater rate than the first portion I1a' with respect to the change in the operating temperature. In those cases, the first current I1' may be greater than the original first current I1.

The second current generator 208 may also be switched on by the first voltage V1' and an output current Iout' may flow through the transistor 244. As discussed above, the output current may mirror the current drawn from the first transistor 216. In cases in which the first current I1' is greater than the original first current I1, the output current Iout' may be greater than the original output current Iout. In those cases, both the internal and external currents may be directly proportional with respect to the change in the operating temperature.

Figure 3:
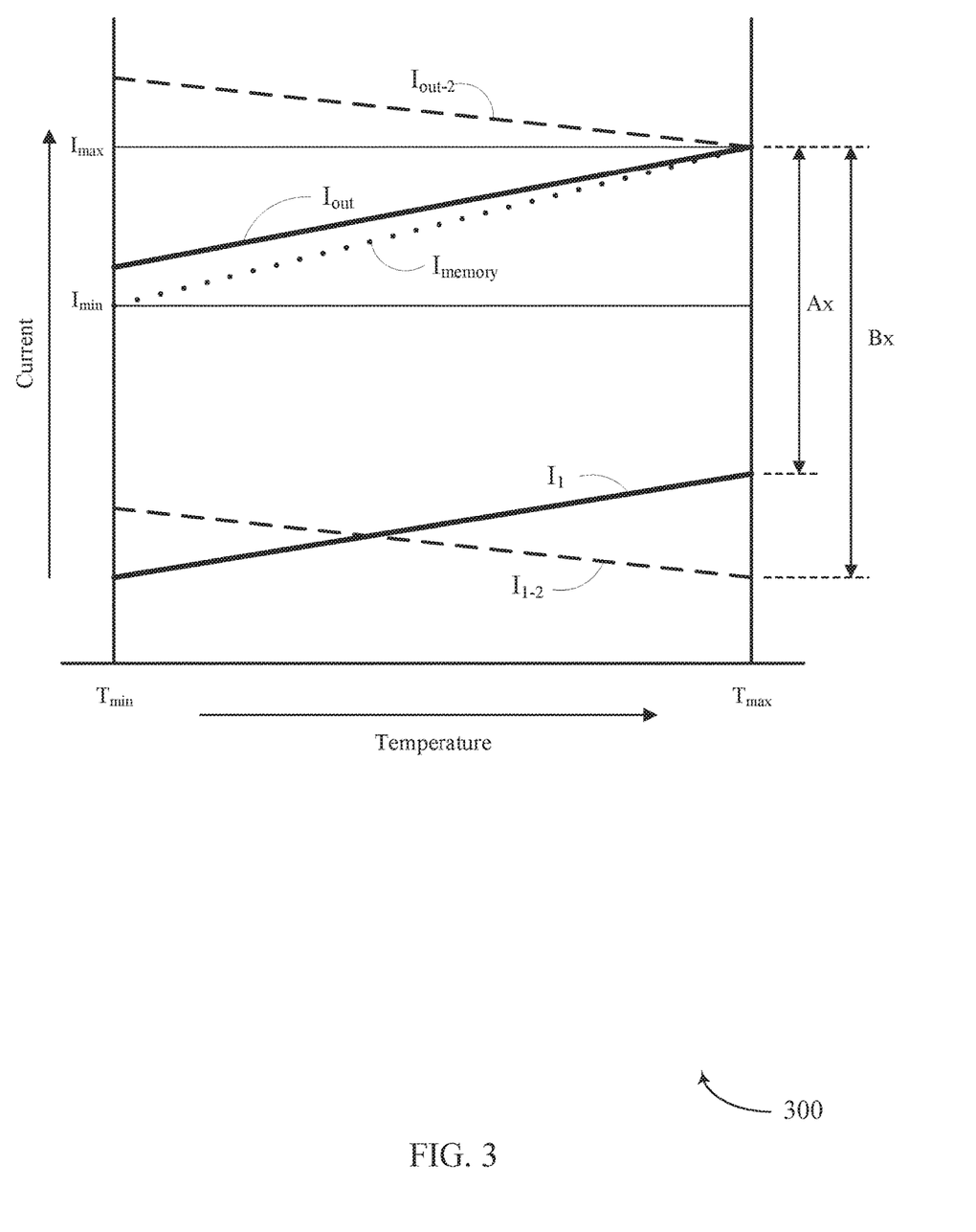
FIG. 3 illustrates a plot showing current distribution with respect to temperature that supports techniques for adjusting current based on operating parameters in accordance with examples as disclosed herein.

FIG. 3 illustrates a plot 300 showing current distribution with respect to temperature that supports techniques for adjusting current based on operating parameters in accordance with examples as disclosed herein. The plot 400 may be illustrative of output and input currents of a power circuit that employs a mirror circuit and of current used by a representative population of memory cells 105 of a memory device 100 between minimum and maximum operating temperatures. For example, the illustrated currents I1 and Iout may respectively reflect the current distribution I1 and Iout associated with the circuit diagram shown in FIG. 2 and Imemory may reflect the current used by the memory cells 105 powered by the circuit 200.

As discussed above, external circuits may use more current at higher temperatures. This may be represented by the dotted line Imemory. Imemory may rise from a minimum amount of current, Imin, used by an external circuit at a minimum operating temperature, Tmin (e.g., −40° C.), of the circuit. Imemory may rise to a maximum amount of current, Imax at a maximum operating temperature, Tmax (e.g., 130° C.), of the circuit. To provide enough current to the external circuit, the output current of the mirror circuit should be greater than or equal to the maximum amount of current, Imax, used by the external circuit. This may occur at the highest operating temperature, Tmax, as depicted.

As discussed above, in some current mirror circuits, the internal and output currents may be inversely proportional to a change in temperature of the external circuit (e.g., circuit 200 without the tracking component 226). That is, as the temperature of the external circuit rises, the internal and output currents may go down. This may be represented by the dashed lines I1-2 and Iout-2. As depicted, when the output current is inversely proportional to the change in temperature, the output current may be greater at lower temperatures in order to provide the maximum current Imax, at the highest operating temperature, Tmax. In such cases, the output current generator may be larger than used and at lower temperatures, efficiency may be lost. At the temperature Tmax, the output current generator may have a gain Bx with respect to the internal current I1-2 to provide the maximum current Imax.

In contrast, in some current mirror circuits, the internal and output currents may be directly proportional to a change in temperature of the external circuit (e.g., circuit 200). That is, as the temperature of the external circuit rises, the internal and output currents may go up. This may be represented by the solid lines I1 and Iout. As depicted, when the output current is directly proportional to the change in temperature, the output current may be less at lower temperatures and still provide the maximum current Imax, at the highest operating temperature, Tmax. So as the operating temperature rises, so does the current Iout to meet the increased power needs Imemory of the external circuit. In such cases, the output current generator can be designed to more closely match the current usage of the external circuit. At the temperature Tmax, the output current generator may have a gain Ax with respect to the internal current I1 to provide the maximum current Imax. As can be seen, the gain A may be less than the gain B to provide the same maximum current Imax. So the output current generator may be smaller and more efficient.

Figure 4:
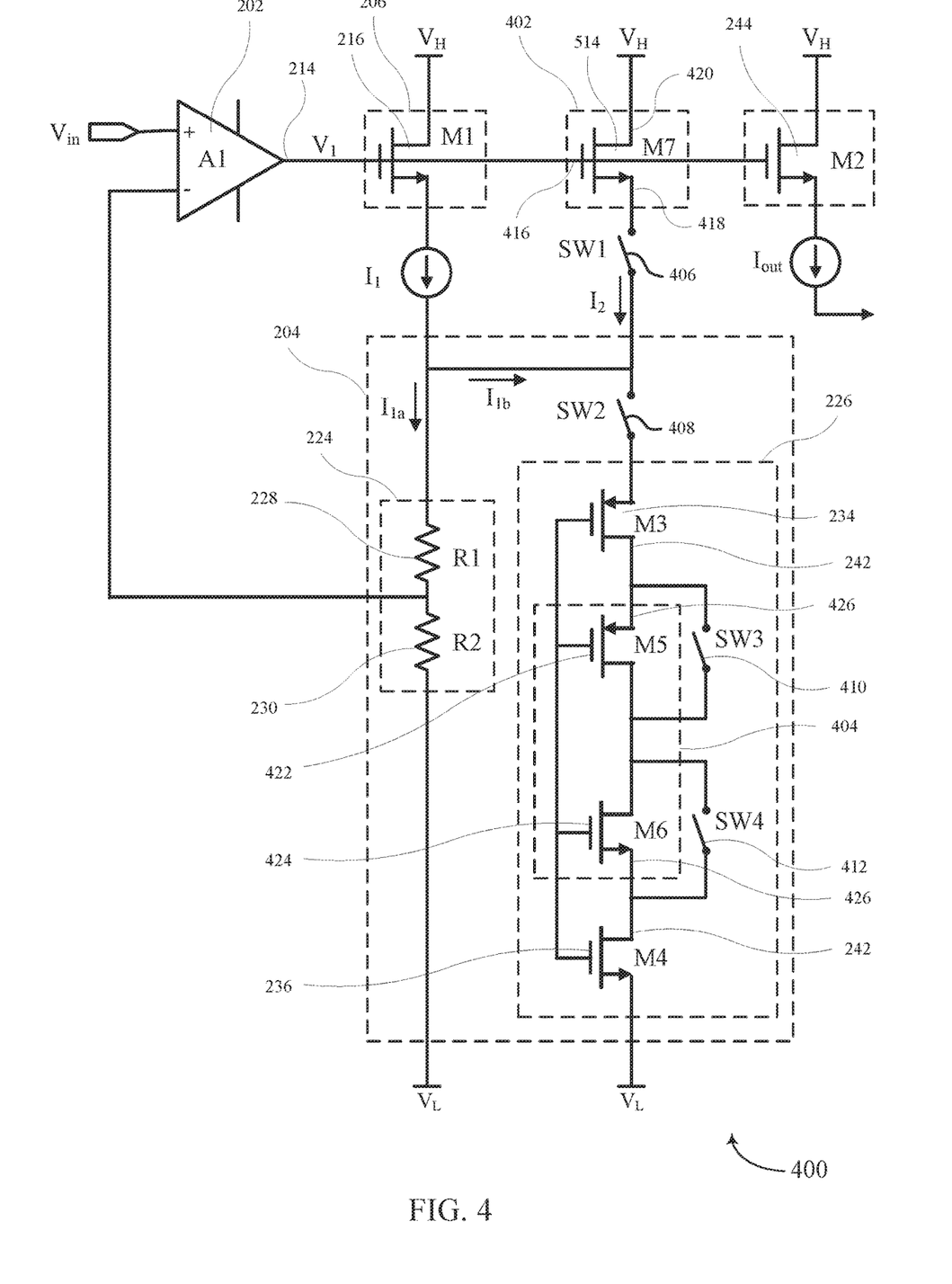
FIG. 4 illustrates an example of a circuit diagram that supports techniques for adjusting current based on operating parameters in accordance with examples as disclosed herein.

FIG. 4 illustrates an example of a circuit diagram 400 that supports techniques for adjusting current based on operating parameters in accordance with examples as disclosed herein. The circuit 400 may be illustrative of a power circuit 170 that provides current to a representative population of memory cells 105 of a memory device. Circuit 400 may include portions of circuit 200, discussed above.

In addition to the devices and components discussed above, the power circuit may include additional devices or components. For example, the circuit diagram 400 may further include a third current generator 402 and a second pair of tracking transistors 404, such as a third tracking transistor 422 and a fourth tracking transistor 424.

Switches may also be included in the power circuit so that a user may select different combinations of components for the power circuit. For example, circuit 400 may include four switches SW1-SW4 that may be used. Of course, other quantities of switches may also be used. The first switch 406 may couple the third current generator 402 to the feedback component 204. The second switch 408 may couple the tracking component 226 to the resistive component 224 and the first current generator 206. The third switch 410 may bypass the third tracking transistor 422. The fourth switch 412 may bypass the fourth tracking transistor 424. To reflect the circuit 200, discussed above, the second switch 408, the third switch 410, and the fourth switch 412 may be closed and the first switch 406 may be opened.

In some examples, the switches may remain open during manufacture and the components may be selected after manufacture by closing one or more of the switches. For example, fuse holders may be incorporated into the memory die so that after the dies are manufactured, fuses may be inserted to close the corresponding switch. Other types of switches may also be used. As such, switches SW1-SW4 may be used to adjust a configuration of a circuit during a manufacturing process before the product is finalized and shipped. In such situations, a circuit may be manufactured with a variety of different configurations and the exact configuration of the final circuit may be selected by activating/deactivating one or more of switches SW1-SW4.

When using the tracking component 226, the first current I1 may be increased significantly when compared to using the resistive component 324 by itself. In some cases, the first current I1 may be doubled or more. For example, the first current may go from 3 μA to 6 μA. This may cause the voltage V1 to also change significantly, which might result in reliability issues. The third current generator 402 may help counteract this by adding a second current that may flow through the tracking component 226.

The third current generator 402 may comprise a third transistor 414. The third transistor 414 may include a gate 416, a source 418, and a drain 420. In some cases, the third transistor 414 may be an example of a power transistor. The drain 420 may be coupled with a high voltage Vh and the gate 416 may be coupled with the output 214 of the amplifier 202. The gate 416 may form a switch that may allow a second current I2 to flow through the transistor 414 from the drain 420 to the source 418. The amount of current may be based on the gain. The third current generator 402 may have a gain of 1. Other gain values may also be possible.

To couple the third current generator 402 with the tracking component 226, the first switch 406 and the second switch 408 may be closed. This may allow the tracking component 226 to draw current from the third current generator 402. So instead of the first portion I1b of the first current I1 flowing through the tracking component 226, the current I2 may flow therethrough. Because of this, the first voltage V1 may remain at around 1.4 or 1.5 volts.

The tracking component 226 may include the second pair of transistors 404, such as the third tracking transistor 422 and the fourth tracking transistor 424, to go along with the first pair of transistors 233. The second pair of transistors 404 may be configured in a similar manner to the first pair of transistors 233. For example, the third tracking transistor 422 and the fourth tracking transistor 424 may be coupled with each other in a diode configuration. To couple the second pair of transistors 404 to the first pair of transistors 233, a source 426 of the third tracking transistor 422 may be coupled with the drain 242 of the first tracking transistor 234 and a source 426 of the fourth tracking transistor 424 may be coupled with the drain 242 of the second tracking transistor 236. In this configuration, the second pair of transistors 404 may be in-line between the first tracking transistor 234 and the second tracking transistor 236. In other examples, the second pair of transistors 404 may be in-line with the first pair of transistors without separating the first pair.

For current to flow through the third tracking transistor 422, the third switch 410 may remain open. For current to flow through the fourth tracking transistor 424, the fourth switch 412 may remain open. With both the third switch 410 and the fourth switch 412 open, the first portion I1b of the first current I1 from the first current generator (or if the first switch 406 is closed, the second current I2 from the third current generator 402) may flow through both pairs of transistors 233, 404. To bypass the third tracking transistor 422, the third switch 410 may be closed. To bypass the fourth tracking transistor 424, the fourth switch 412 may be closed. With both the third switch 410 and the fourth switch 412 closed, the second set of transistors 404 may be bypassed so that the first portion I1b of the first current I1 or the second current I2 may flow only through the first pair of transistors 233.

Figure 5:
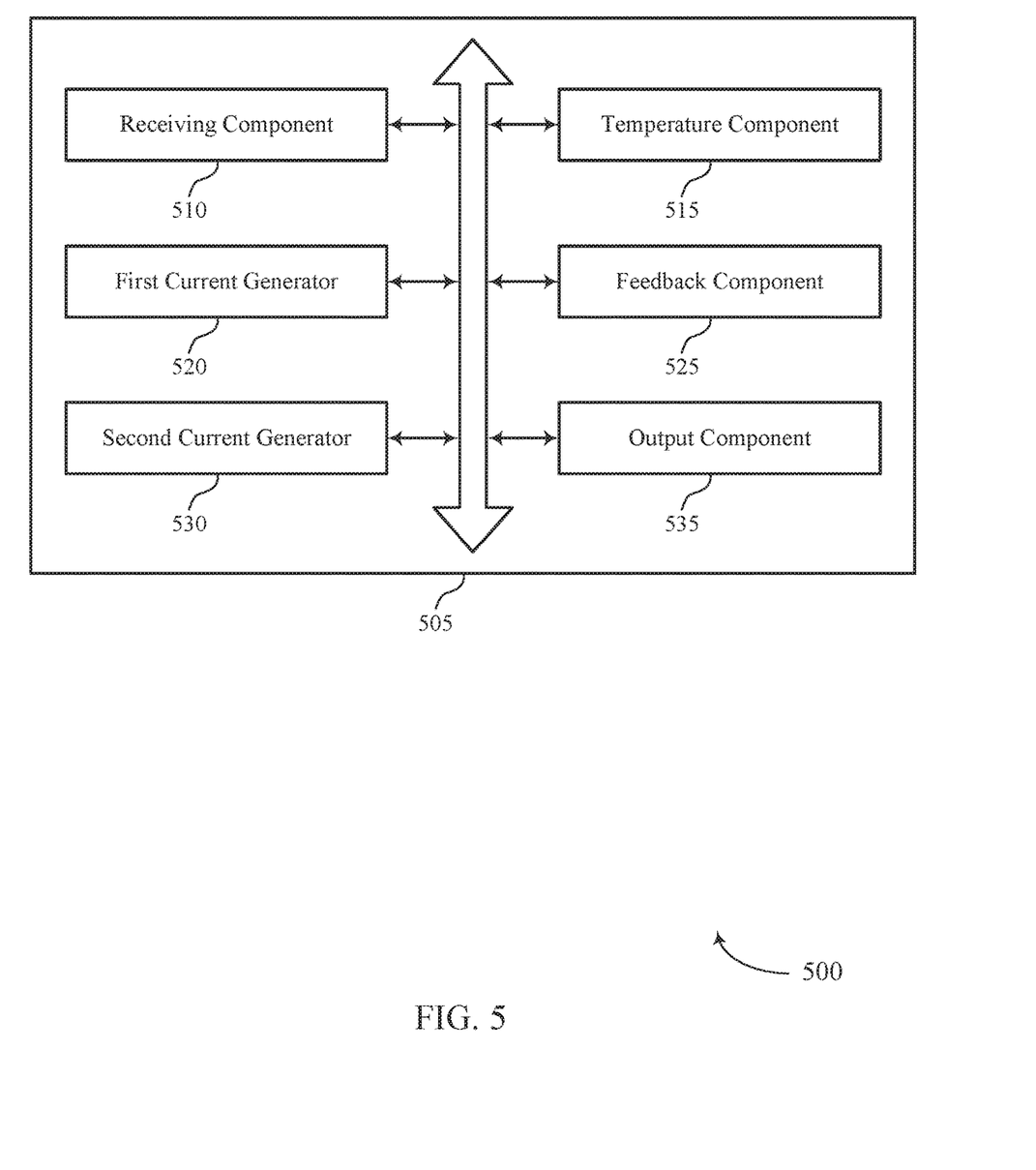
FIG. 5 shows a block diagram of a memory device that supports techniques for adjusting current based on operating parameters in accordance with examples as disclosed herein.

FIG. 5 shows a block diagram 500 of a memory device 505 that supports techniques for adjusting current based on operating parameters in accordance with examples as disclosed herein. The memory device 505 may be an example of aspects of a memory device as described with reference to FIGS. 1-4. The memory device 505 may include a receiving component 510, a temperature component 515, a first current generator 520, a feedback component 525, a second current generator 530, and an output component 535. Each of these modules may communicate, directly or indirectly, with one another (e.g., via one or more buses).

The receiving component 510 may receive an input voltage at an input of an amplifier.

The temperature component 515 may identify an operating temperature of a memory device that is associated with the input voltage. In some examples, the temperature component 515 may identify a second operating temperature of the memory device that is greater than the operating temperature.

The first current generator 520 may generate a first current based on a voltage at an output of the amplifier, the first current being proportional to the operating temperature. In some examples, the first current generator 520 may generate a third current based on the voltage at the output of the amplifier, the third current being greater than the first current.

The feedback component 525 may draw the first current generated by the first current generator. In some examples, the feedback component 525 may draw, by a resistive component of the feedback component, a first portion of the first current and, by a tracking component of the feedback component, a second portion of the first current. In some examples, the feedback component 525 may draw the third current generated by the first current generator.

The second current generator 530 may generate a second current for an array of memory cells based on drawing the first current by the feedback component, the second current mirroring the first current and being proportional to the operating temperature. In some cases, a first direction of change of the second current is proportional to a second direction of change of the first current with respect to a change in the operating temperature. In some examples, the second current generator 530 may generate a fourth current for the array of memory cells, the fourth current being greater than the second current.

The output component 535 may output, to the array of memory cells, the second current generated by the second current generator. In some examples, the output component

535 may output, to the array of memory cells, the fourth current generated by the second current generator.

Figure 6:
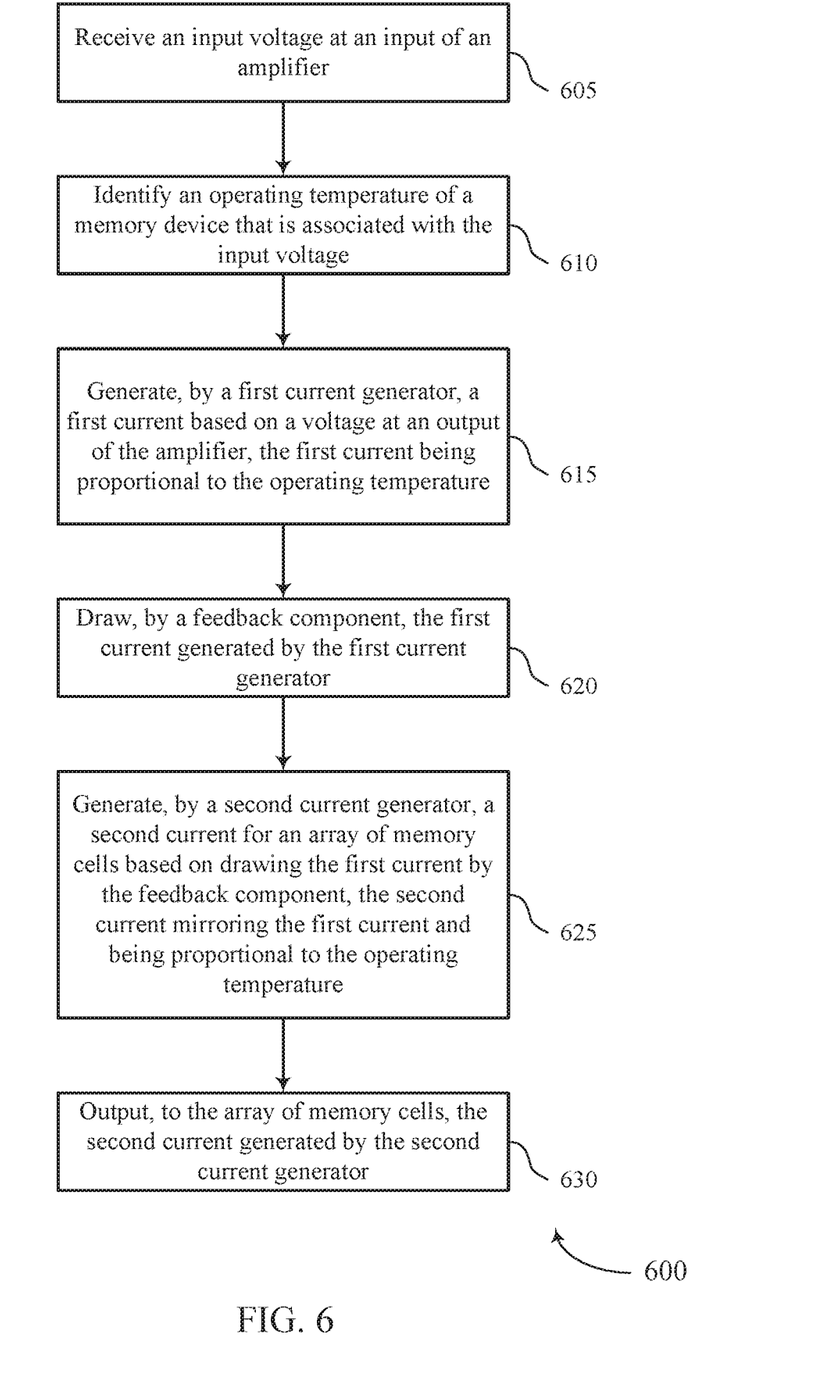
FIG. 6 shows a flowchart illustrating a method or methods that support techniques for adjusting current based on operating parameters in accordance with examples as disclosed herein.

FIG. 6 shows a flowchart illustrating a method or methods 600 that supports techniques for adjusting current based on operating parameters in accordance with examples as disclosed herein. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may receive an input voltage at an input of an amplifier. The operations of 605 may be performed according to the methods described herein. In some examples, aspects of the operations of 605 may be performed by a receiving component as described with reference to FIG. 5.

At 610, the memory device may identify an operating temperature of a memory device that is associated with the input voltage. The operations of 610 may be performed according to the methods described herein. In some examples, aspects of the operations of 610 may be performed by a temperature component as described with reference to FIG. 5.

At 615, the memory device may generate a first current based on a voltage at an output of the amplifier, the first current being proportional to the operating temperature. The operations of 615 may be performed according to the methods described herein. In some examples, aspects of the operations of 615 may be performed by a first current generator as described with reference to FIG. 5.

At 620, the memory device may draw the first current generated by the first current generator. The operations of 620 may be performed according to the methods described herein. In some examples, aspects of the operations of 620 may be performed by a feedback component as described with reference to FIG. 5.

At 625, the memory device may generate a second current for an array of memory cells based on drawing the first current by the feedback component, the second current mirroring the first current and being proportional to the operating temperature. The operations of 625 may be performed according to the methods described herein. In some examples, aspects of the operations of 625 may be performed by a second current generator as described with reference to FIG. 5.

At 630, the memory device may output, to the array of memory cells, the second current generated by the second current generator. The operations of 630 may be performed according to the methods described herein. In some examples, aspects of the operations of 630 may be performed by an output component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for receiving an input voltage at an input of an amplifier, identifying an operating temperature of a memory device that is associated with the input voltage, generating, by a first current generator, a first current based on a voltage at an output of the amplifier, the first current being proportional to the operating temperature, drawing, by a feedback component, the first current generated by the first current generator, generating, by a second current generator, a second current for an array of memory cells based on drawing the first current by the feedback component, the second current mirroring the first current and being proportional to the operating temperature, and outputting, to the array of memory cells, the second current generated by the second current generator.

In some examples of the method 600 and the apparatus described herein, a first direction of change of the second current may be proportional to a second direction of change of the first current with respect to a change in the operating temperature.

In some examples of the method 600 and the apparatus described herein, drawing the first current may include operations, features, means, or instructions for drawing, by a resistive component of the feedback component, a first portion of the first current, and drawing, by a tracking component of the feedback component, a second portion of the first current.

Some examples of the method 600 and the apparatus described herein may further include operations, features, means, or instructions for identifying a second operating temperature of the memory device that may be greater than the operating temperature, generating, by the first current generator, a third current based on the voltage at the output of the amplifier, the third current being greater than the first current, drawing, by the feedback component, the third current generated by the first current generator, generating, by the second current generator, a fourth current for the array of memory cells, the fourth current being greater than the second current, and outputting, to the array of memory cells, the fourth current generated by the second current generator.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include an amplifier including an input for receiving a first voltage and an output for outputting a second voltage that is based on the first voltage, a first current generator coupled with the output of the amplifier and for generating a first current based on the second voltage output by the amplifier, a feedback component coupled with the first current generator and for modifying the first current based on an operating temperature associated with the apparatus, the first current being proportional to the operating temperature, and a second current generator coupled with the first current generator and for generating a second current based on the first current modified by the feedback component.

In some examples, a first direction of change of the first current and a second direction of change of the second current may be both proportional to a change in the operating temperature based on the feedback component modifying the first current.

In some examples, the feedback component may include operations, features, means, or instructions for a resistive component coupled with the first current generator and the input of the amplifier and for drawing a first portion of the first current from the first current generator, and a tracking component coupled with the first current generator and for drawing a second portion of the first current from the first current generator.

In some examples, the first portion of the first current may be inversely proportional with respect to a change in the operating temperature and the second portion of the first current may be proportional with respect to the change in the operating temperature.

In some examples, the tracking component includes a pair of transistors configured to receive the second portion of the first current. In some examples, the pair of transistors includes a p-channel transistor and an n-channel transistor. In some examples, the transistors may be coupled with each other in a diode configuration.

In some examples, the tracking component includes a second pair of transistors coupled with each other in a diode configuration and configured to receive the second portion of the first current.

In some examples, the first current generator may be configured to have a first gain, and the second current generator may be configured to have a second gain higher than the first gain of the first current generator.

In some examples, the feedback component includes a resistive component and a tracking component both coupled with the first current generator, the resistive component being coupled with the amplifier and configured to provide feedback to the amplifier and the tracking component configured to track the second current generated by the second current generator.

An apparatus is described. The apparatus may include an amplifier including a first input for receiving a first voltage, a second input, and an output, a first transistor having a gate and a source, the gate coupled with the output of the amplifier, a resistive component having an input coupled with the source of the first transistor, the resistive component also being coupled with the second input of the amplifier, a tracking component having an input coupled with the source of the first transistor, the tracking component including a pair of transistors coupled with each other in a diode configuration, and a second transistor having a gate and a source, the gate coupled with the output of the amplifier, the second transistor being configured to generate a first current on the source of the second transistor that mirrors a second current generated on the source of the first transistor.

In some examples, the tracking component may be configured to cause a first direction of change of the first current and a second direction of change of the second current to both be proportional to a change in temperature.

In some examples, a source of a p-channel transistor of the pair of transistors may be coupled with the input of the tracking component, a source of an n-channel transistor of the pair of transistors may be coupled with ground, and the gates and the drains of the p-channel transistor and the n-channel transistor may be coupled together.

In some examples, the tracking component further includes a second pair of transistors coupled with each other in the diode configuration, where the second pair of transistors may be coupled with the pair of transistors.

In some examples, the first transistor may be configured to may have a first gain, and the second transistor may be configured to may have a second gain that may be higher than the first gain of the first transistor.

In some examples, the amplifier includes a non-inverting amplifier in which the first input may be a positive input and the second input may be a negative input.

The term "coupled" may refer to a relationship between components that supports the flow of signals between the components. Components are considered coupled with one another if there is any conductive path between the components that can, at any time, support the flow of signals between the components. At any given time, the conductive path between components that are coupled with each other may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   an amplifier comprising an input for receiving a first voltage and an output for outputting a second voltage that is based at least in part on the first voltage;
   a first current generator coupled with the output of the amplifier and for generating a first current based at least in part on the second voltage output by the amplifier;
   a feedback component coupled with the first current generator and for modifying the first current based at least in part on an operating temperature associated with the apparatus, the first current being proportional to the operating temperature, the feedback component comprising:
      a resistive component coupled with the first current generator and the input of the amplifier and for drawing a first portion of the first current from the first current generator; and
      a tracking component coupled with the first current generator and for drawing a second portion of the first current from the first current generator; and
   a second current generator coupled with the first current generator and for generating a second current based at least in part on the first current modified by the feedback component.

2. The apparatus of claim 1, wherein a first direction of change of the first current and a second direction of change of the second current are both proportional to a change in the operating temperature based at least in part on the feedback component modifying the first current.

3. The apparatus of claim 1, wherein the first portion of the first current is inversely proportional with respect to a change in the operating temperature and the second portion of the first current is proportional with respect to the change in the operating temperature.

4. The apparatus of claim 1, wherein the tracking component comprises a pair of transistors configured to receive the second portion of the first current.

5. The apparatus of claim 4, wherein the pair of transistors comprises a p-channel transistor and an n-channel transistor.

6. The apparatus of claim 4, wherein the transistors are coupled with each other in a diode configuration.

7. The apparatus of claim 4, wherein the tracking component comprises a second pair of transistors coupled with each other and configured to receive the second portion of the first current.

8. The apparatus of claim 1, wherein:
   the first current generator is configured to have a first gain; and
   the second current generator is configured to have a second gain higher than the first gain of the first current generator.

9. An apparatus, comprising:
   an amplifier comprising an input for receiving a first voltage and an output for outputting a second voltage that is based at least in part on the first voltage;
   a first current generator coupled with the output of the amplifier and for generating a first current based at least in part on the second voltage output by the amplifier;
   a feedback component coupled with the first current generator and for modifying the first current based at least in part on an operating temperature associated with the apparatus, the first current being proportional to the operating temperature; and
   a second current generator coupled with the first current generator and for generating a second current based at least in part on the first current modified by the feedback component,
   wherein the feedback component comprises a resistive component and a tracking component both coupled with the first current generator, the resistive component being coupled with the amplifier and configured to provide feedback to the amplifier and the tracking component configured to track the second current generated by the second current generator.

10. An apparatus, comprising:
    an amplifier comprising a first input for receiving a first voltage, a second input, and an output;
    a first transistor having a gate and a source, the gate coupled with the output of the amplifier;
    a resistive component having an input coupled with the source of the first transistor, the resistive component also being coupled with the second input of the amplifier;
    a tracking component having an input coupled with the source of the first transistor, the tracking component comprising a pair of transistors coupled with each other in a diode configuration; and
    a second transistor having a gate and a source, the gate coupled with the output of the amplifier, the second transistor being configured to generate a first current on the source of the second transistor that mirrors a second current generated on the source of the first transistor.

11. The apparatus of claim 10, wherein the tracking component is configured to cause a first direction of change of the first current and a second direction of change of the second current to both be proportional to a change in temperature.

12. The apparatus of claim 10, wherein:
    a source of a p-channel transistor of the pair of transistors is coupled with the input of the tracking component;
    a source of an n-channel transistor of the pair of transistors is coupled with ground; and
    the gates and the drains of the p-channel transistor and the n-channel transistor are coupled together.

13. The apparatus of claim 10, wherein the tracking component further comprises a second pair of transistors coupled with each other, wherein the second pair of transistors are coupled with the pair of transistors.

14. The apparatus of claim 10, wherein:
    the first transistor is configured to have a first gain; and
    the second transistor is configured to have a second gain that is higher than the first gain of the first transistor.

15. The apparatus of claim 10, wherein the amplifier comprises a non-inverting amplifier in which the first input is a positive input and the second input is a negative input.

16. A method, comprising:
    receiving an input voltage at an input of an amplifier;
    identifying an operating temperature of a memory device that is associated with the input voltage;

generating, by a first current generator, a first current based at least in part on a voltage at an output of the amplifier, the first current being proportional to the operating temperature;

drawing, by a feedback component, the first current generated by the first current generator, wherein drawing the first current comprises:

drawing, by a resistive component of the feedback component, a first portion of the first current; and     drawing, by a tracking component of the feedback component, a second portion of the first current;

generating, by a second current generator, a second current for an array of memory cells based at least in part on drawing the first current by the feedback component, the second current mirroring the first current and being proportional to the operating temperature; and outputting, to the array of memory cells, the second current generated by the second current generator.

17. The method of claim 16, wherein a first direction of change of the second current is proportional to a second direction of change of the first current with respect to a change in the operating temperature.

18. A method, comprising:

receiving an input voltage at an input of an amplifier;

identifying an operating temperature of a memory device that is associated with the input voltage;

generating, by a first current generator, a first current based at least in part on a voltage at an output of the amplifier, the first current being proportional to the operating temperature;

drawing, by a feedback component, the first current generated by the first current generator;

generating, by a second current generator, a second current for an array of memory cells based at least in part on drawing the first current by the feedback component, the second current mirroring the first current and being proportional to the operating temperature; and outputting, to the array of memory cells, the second current generated by the second current generator;

identifying a second operating temperature of the memory device that is greater than the operating temperature;

generating, by the first current generator, a third current based at least in part on the voltage at the output of the amplifier, the third current being greater than the first current;

drawing, by the feedback component, the third current generated by the first current generator;

generating, by the second current generator, a fourth current for the array of memory cells, the fourth current being greater than the second current; and outputting, to the array of memory cells, the fourth current generated by the second current generator.

\* \* \* \* \*